(12) United States Patent
Lin et al.

(10) Patent No.: US 12,211,699 B2
(45) Date of Patent: Jan. 28, 2025

(54) METHOD OF REMOVING STEP HEIGHT ON GATE STRUCTURE

(71) Applicant: UNITED MICROELECTRONICS CORP., Hsin-Chu (TW)

(72) Inventors: Yeh-Sheng Lin, Tainan (TW); Chang-Mao Wang, Tainan (TW); Chun-Chi Yu, Taipei (TW); Chung-Yi Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 462 days.

(21) Appl. No.: 17/857,158

(22) Filed: Jul. 4, 2022

(65) Prior Publication Data
US 2023/0402288 A1    Dec. 14, 2023

(30) Foreign Application Priority Data
Jun. 8, 2022   (TW) .................................. 111121255

(51) Int. Cl.
*H01L 21/311* (2006.01)
*H01L 21/768* (2006.01)

(52) U.S. Cl.
CPC ... *H01L 21/31111* (2013.01); *H01L 21/31144* (2013.01); *H01L 21/76802* (2013.01)

(58) Field of Classification Search
CPC .................................................. H01L 23/31111
See application file for complete search history.

(56) References Cited

U.S. PATENT DOCUMENTS

| 8,313,889 | B2 | 11/2012 | Yu | |
|---|---|---|---|---|
| 8,916,337 | B2 | 12/2014 | Arnold | |
| 9,570,397 | B1* | 2/2017 | Fan | ......... H01L 23/528 |
| 2016/0049330 | A1* | 2/2016 | Peng | .................. H01L 23/5226 257/774 |
| 2019/0273083 | A1* | 9/2019 | Liou | ...................... H10B 12/01 |
| 2022/0344169 | A1* | 10/2022 | Han | .................. H01L 21/02186 |

FOREIGN PATENT DOCUMENTS

| TW | I302747 | 11/2008 |
|---|---|---|
| TW | I535024 B | 5/2016 |

* cited by examiner

*Primary Examiner* — William A Harriston
(74) *Attorney, Agent, or Firm* — Winston Hsu (57) ABSTRACT

A method of removing a step height on a gate structure includes providing a substrate. A gate structure is disposed on the substrate. A dielectric layer covers the gate structure and the substrate. Then, a composite material layer is formed to cover the dielectric layer. Later, part of the composite material layer is removed to form a step height disposed directly on the gate structure. Subsequently, a wet etching is performed to remove the step height. After the step height is removed, the dielectric layer is etched to form a first contact hole to expose the gate structure.

6 Claims, 7 Drawing Sheets

METHOD OF REMOVING STEP HEIGHT ON GATE STRUCTURE

BACKGROUND OF THE INVENTION

1. Field of the Invention

The present invention relates to a method of removing a step height on a gate structure, and more particularly to a method of removing the step height by using a wet etching.

2. Description of the Prior Art

Various techniques have been attempted to form efficient interconnections in order to thin and shrink electronic devices and to increase integration of semiconductor elements. The aforesaid interconnections includes numerous horizontal interconnects and plugs connecting to interconnections such as source/drain plugs or gate plugs.

However, in the integrated process of fabricating the source/drain plugs and the gate plugs, the depth of the gate plug may become inconsistent. For example, the depth of some gate plugs may contact the gate, and some gate plugs which are not deep enough can't contact the gate. This inconsistency in depth will cause electrical defects.

SUMMARY OF THE INVENTION

In view of this, the present invention provides a method for removing a step height directly on the gate structure to form a contact hole with sufficient depth, so that the gate plug formed subsequently in the contact hole can contact the gate structure.

According to a preferred embodiment of the present invention, a method of removing a step height on a gate structure includes providing a substrate, wherein a gate structure is disposed on the substrate and a dielectric layer covers the gate structure and the substrate. Then, a composite material layer is formed to cover the dielectric layer, wherein the composite material layer includes an etching stop layer, a sacrifice layer and a metal-containing layer stacked from bottom to top. Subsequently, part of the composite material layer is removed to form a step height disposed directly on the gate structure. Next, a wet etching is performed to remove the step height. After removing the step height, the dielectric layer is etched to form a first contact hole to expose the gate structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 depict a method of removing a step height on a gate structure according to a preferred embodiment of the present invention, wherein:

FIG. 9 to FIG. 10 depict a fabricating method of a contact hole according to an example of the present invention, wherein:

DETAILED DESCRIPTION

FIG. 1 to FIG. 8 depict a method of removing a step height on a gate structure according to a preferred embodiment of the present invention.

Figure 1:
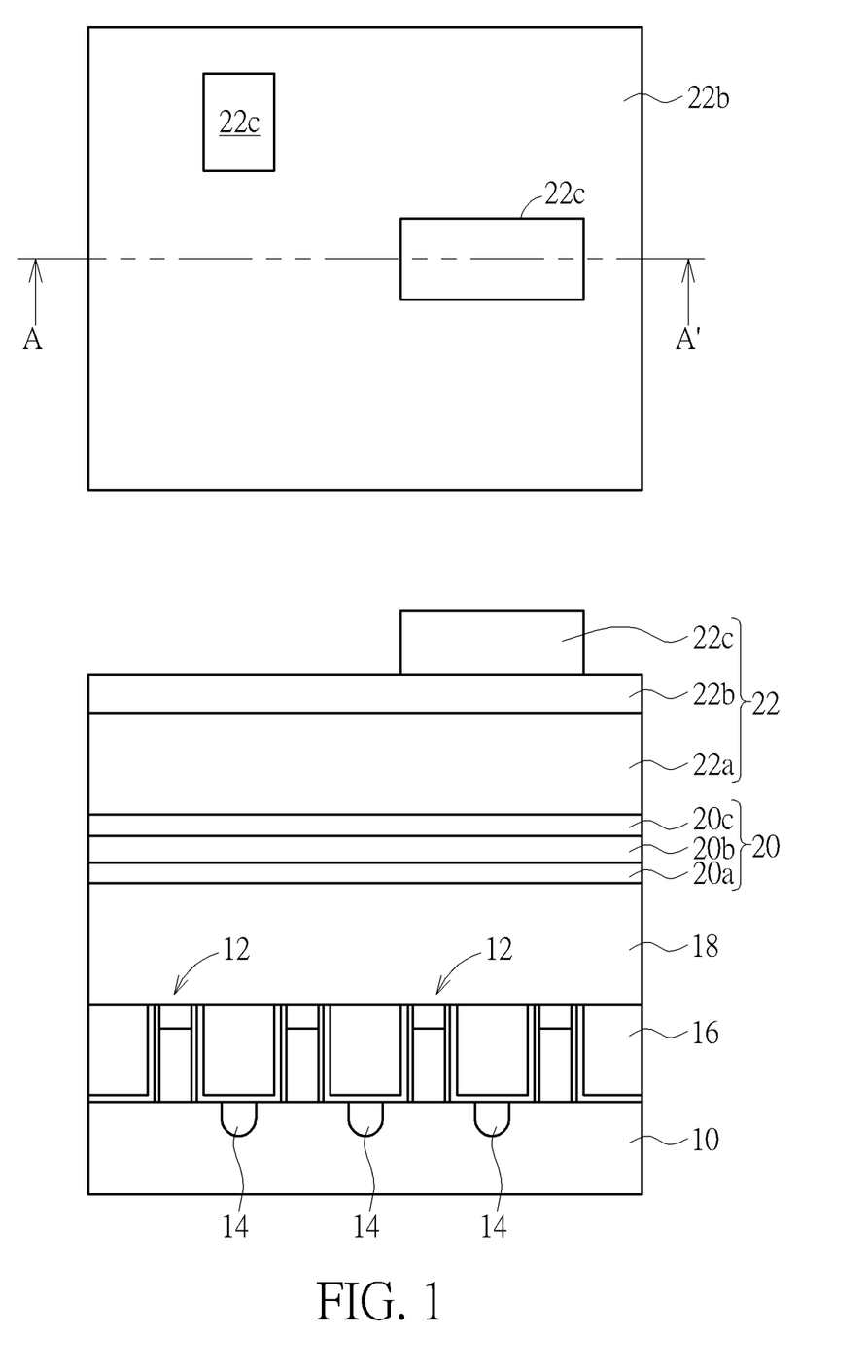
FIG. 1 depicts a triple-layered photoresist covering a gate structure.

Please refer to FIG. 1. The lower figure in FIG. 1 is a sectional view taken along line AA' of the upper figure in FIG. 1. As shown in FIG. 1, a substrate 10 is provided. The substrate 10 can be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. A gate structure 12 is disposed on the substrate 10. Numerous gate structures 12 are shown in FIG. 1 as an example. The gate structure 12 includes a conductive material layer and an insulating material layer. The insulating material layer is disposed under the conductive material layer. The conductive material layer can be Al, W, or Ti. A source/drain doping region 14 is disposed in the substrate 10 at one side of the gate structure 12. In FIG. 1, each gate structure 12 has two source/drain doping regions 14 respectively disposed at two sides of the gate structure 12. Furthermore, a dielectric layer 16 covers the gate structure 12 and the substrate 10. An interlayer dielectric 18 covers the dielectric layer 18, the gate structure 12 and the substrate 10. The dielectric layer 16 and the interlayer dielectric 18 may be silicon oxide formed by a chemical vapor deposition, an atomic layer deposition or a physical vapor deposition. After that, a composite material layer 20 is formed to cover the interlayer dielectric 18. The composite material layer 20 includes an etching stop layer 20a, a sacrifice layer 20b and a metal-containing layer 20c stacked from bottom to top. According to a preferred embodiment of the present invention, the sacrifice layer 20b includes silicon oxide, the etching stop layer 20a includes silicon nitride and the metal-containing layer 20c includes titanium nitride or tungsten nitride, but not limited to materials listed above. Any material that can be removed entirely by dilute hydrofluoric acid can be used as the sacrifice layer 20b. Any material that can be removed entirely by phosphoric acid can be used as the etching stop layer 20a. Next, a triple-layered photoresist 22 is formed to cover the composite material layer 20. The triple-layered photoresist 22 includes an anti-reflective coating (ARC) layer 22a, a hard mask 22b and a photoresist 22c. Thereafter, part of the triple-layered photoresist 22 is removed. The triple-layered photoresist 22 which is patterned defines a segmenting region of a source/drain contact hole on the source/drain doping region 14. The source/drain contact hole will be formed afterwards.

Figure 2:
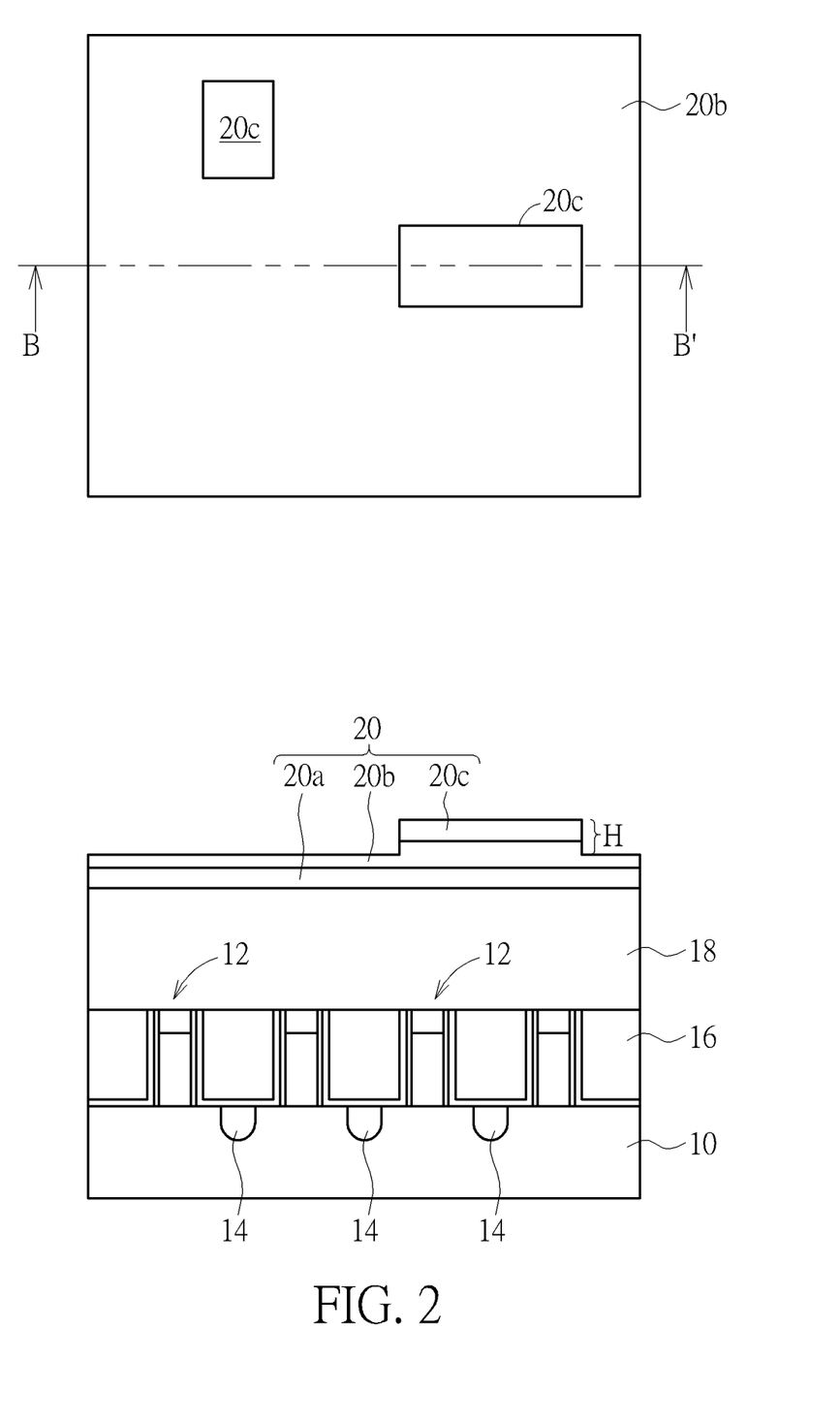
FIG. 2 is a fabricating stage following FIG. 1.

Please refer to FIG. 2. The lower figure in FIG. 2 is a sectional view taken along line BB' of the upper figure in FIG. 2. As shown in FIG. 2, the pattern on the triple-layered photoresist 22 which is patterned is transferred to the hard mask 22 and the ARC layer 22a. Next, part of the composite material layer 20 is removed by taking the hard mask 22b and the ARC layer 22a as a mask to form a step height H directly on the gate structure 12. The step height H extends to overlap a source/drain doping region 14. Then, the hard mask 22b and the ARC layer 22a are removed. In details, after the step height H defining the segmenting region of the source/drain contact hole which will be formed above the source/drain doping region 14, during the steps of removing part of the composite material layer 20, the metal-containing layer 20c not covered by the hard mask 22b is entirely removed, the sacrifice layer 20b which is not covered by the hard mask 22b is thinned, and the etching stop layer 20a which is covered by the sacrifice layer 20b entirely remains. The step height H protrudes from the sacrifice layer 20b. The step height H consists of the sacrifice layer 20b and the metal-containing layer 20c.

Figure 3:
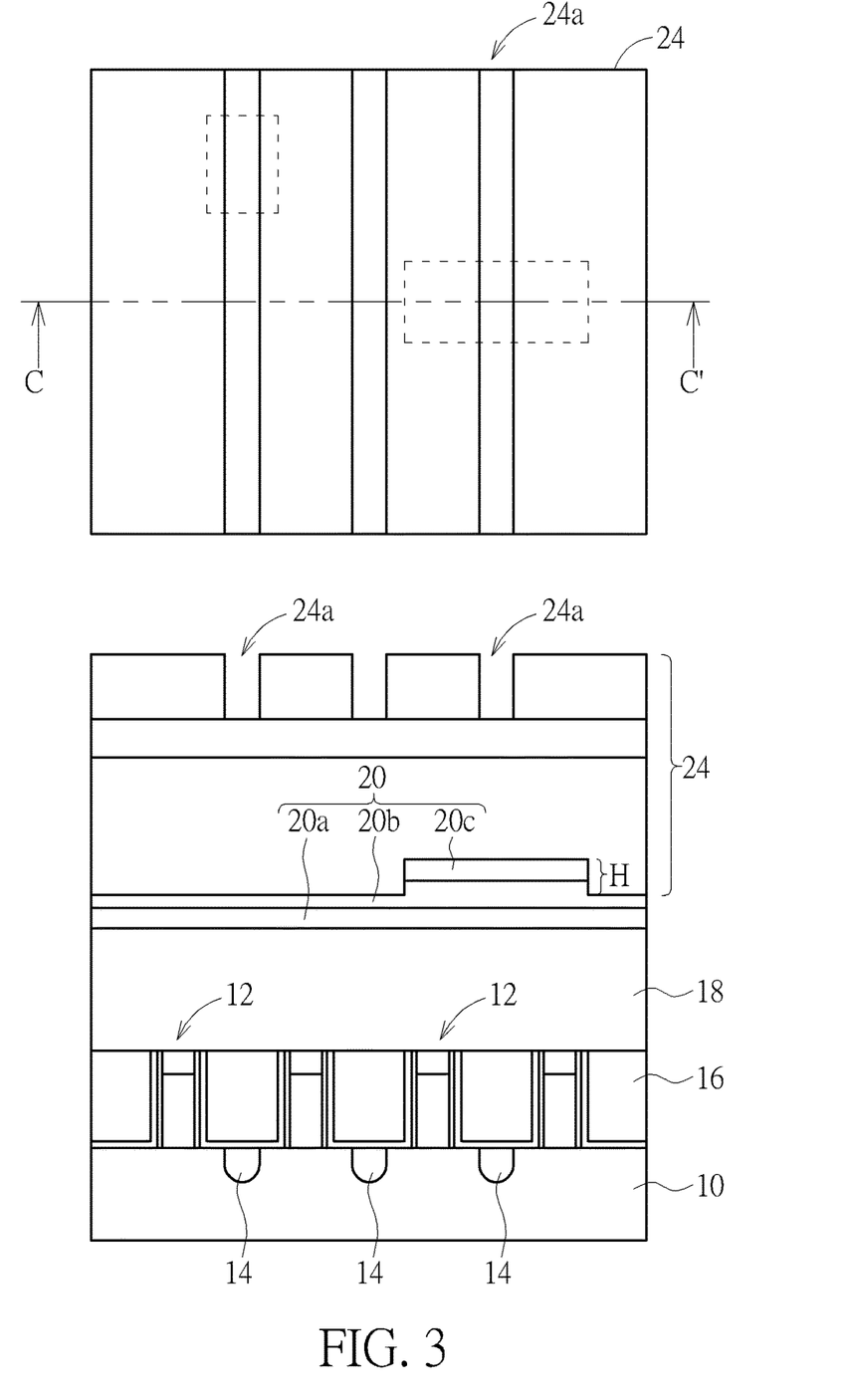
FIG. 3 is a fabricating stage following FIG. 2.
Figure 4:
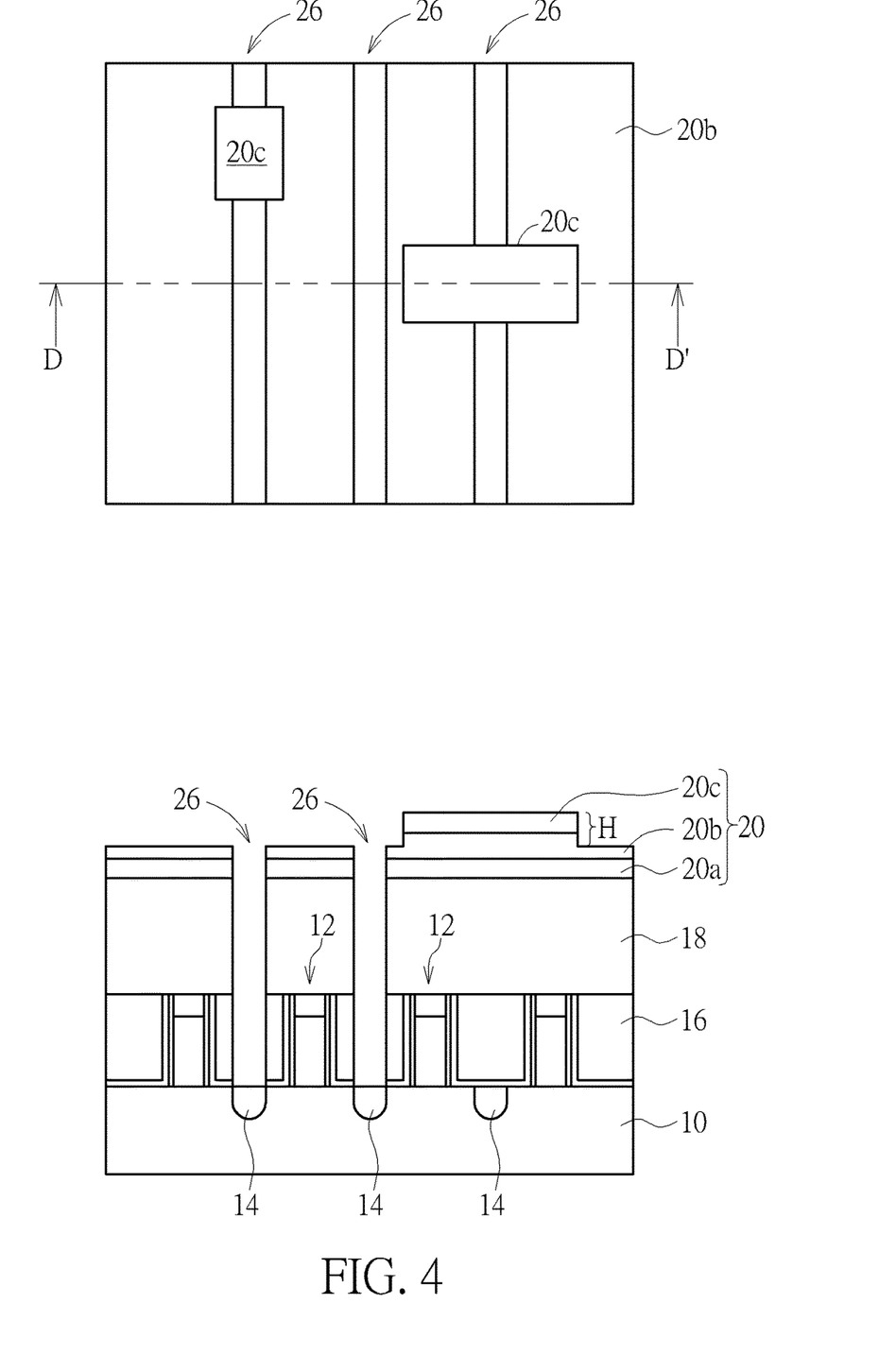
FIG. 4 is a fabricating stage following FIG. 3.

Please refer to FIG. 3. The lower figure in FIG. 3 is a sectional view taken along line CC' of the upper figure in FIG. 3. As shown in FIG. 3, a patterned mask 24 such as a patterned triple-layered photoresist covers the step height H and the entirety of the substrate 10. The structure of the triple-layered photoresist in FIG. 3 is the same as that of the triple-layered photoresist 22. An opening 24a of the patterned mask 24 defines the position of the source/drain contact hole. The source/drain doping region 14 will be exposed through the source/drain contact hole. Please refer to FIG. 4. The lower figure in FIG. 4 is a sectional view taken along line DD' of the upper figure in FIG. 4. As shown in FIG. 4, the sacrifice layer 20b, the etching stop layer 20a, the interlayer dielectric 18 and the dielectric layer 16 are etched by taking the patterned mask 24 and the step height H as masks to form a source/drain contact hole 26. Now, the source/drain doping region 14 is exposed through the source/drain contact hole 26. Next, the patterned mask 24 is removed entirely. It is noteworthy that the etchant does not etch the metal-containing layer 20c, therefore the sacrifice layer 20b, the etching stop layer the interlayer dielectric 18 and the dielectric layer 16 which are covered by the step height H are not etched. In this way, the source/drain contact hole 26 can be segmented.

Figure 5:
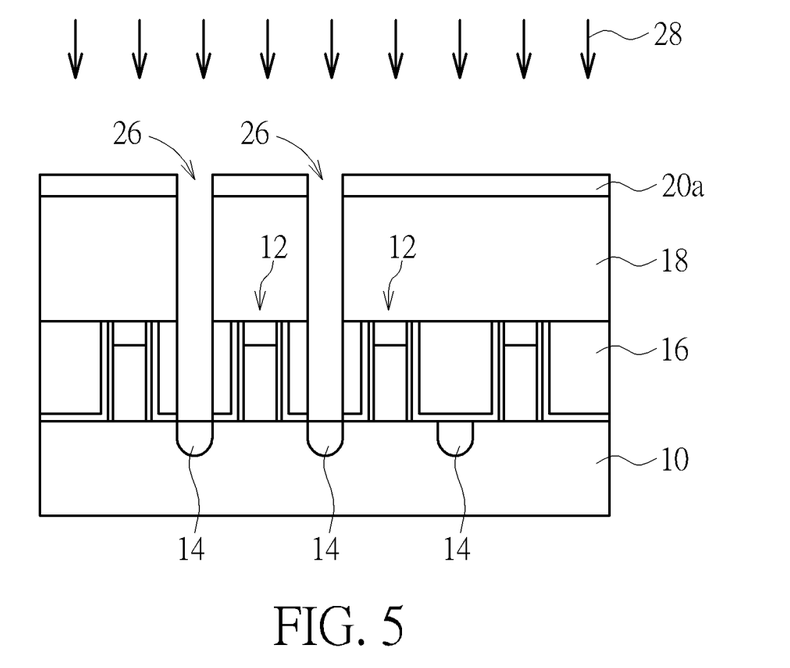
FIG. 5 is a fabricating stage following FIG. 4.
Figure 6:
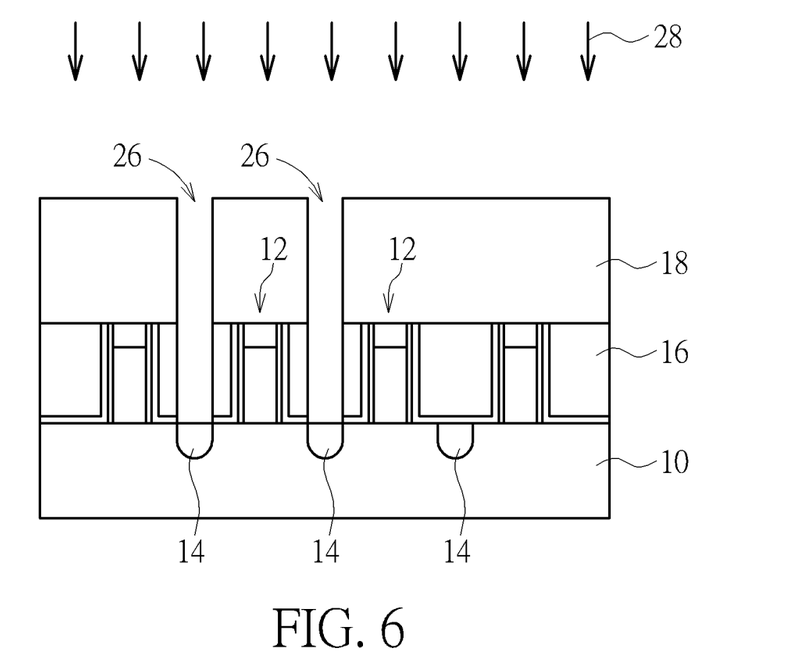
FIG. 6 is a fabricating stage following FIG. 5.

As shown in FIG. 5 and FIG. 6, a wet etching 28 is performed to remove the step height H. In details, as shown in FIG. 5 and FIG. 6, the wet etching 28 includes removing the sacrifice layer 20b entirely by using dilute hydrofluoric acid followed by removing the etching stop layer 20a entirely by using phosphoric acid. Although dilute hydrofluoric acid does not etch the metal-containing layer 20c, however, because the sacrifice layer 20b is etched by dilute hydrofluoric acid, the metal-containing layer 20c loses its attaching surface and will be cleaned along with the sacrifice layer 20b. Now, the step height H is completely removed. Because the etching stop layer 20a is silicon nitride, silicon nitride and the material of the interlayer dielectric 18 have high etching selectivity with respective to phosphoric acid. Therefore, when the etching stop layer 20a is removed by phosphoric acid, the interlayer dielectric 18 is not damaged. It is noteworthy that after the etching stop layer 20a is removed, the interlayer dielectric 18 directly on the gate structure 12 is coplanar. Now, the method of removing the step height on the gate structure is completed.

Figure 7:
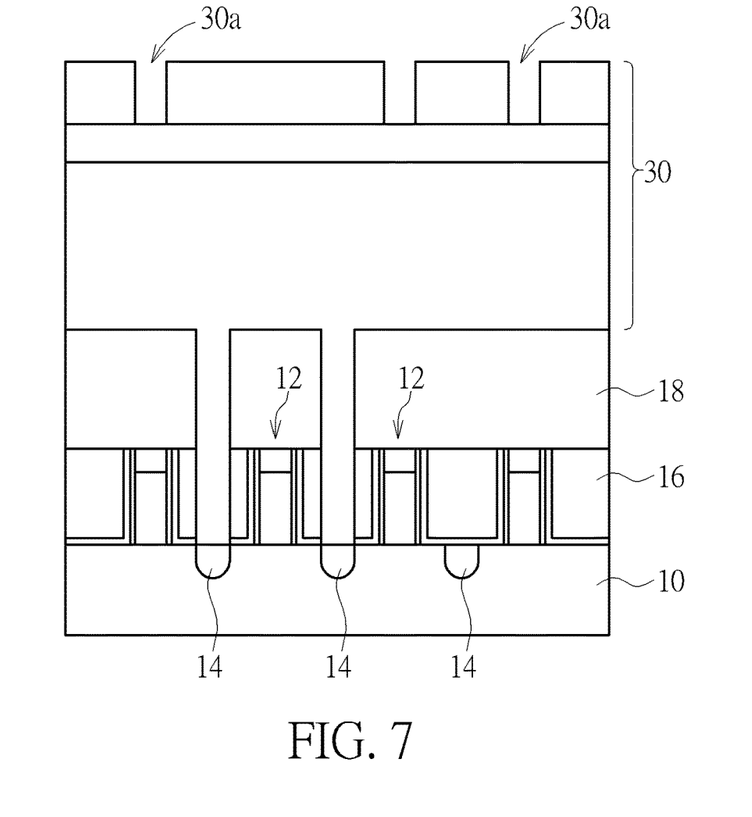
FIG. 7 is a fabricating stage following FIG. 6.
Figure 8:
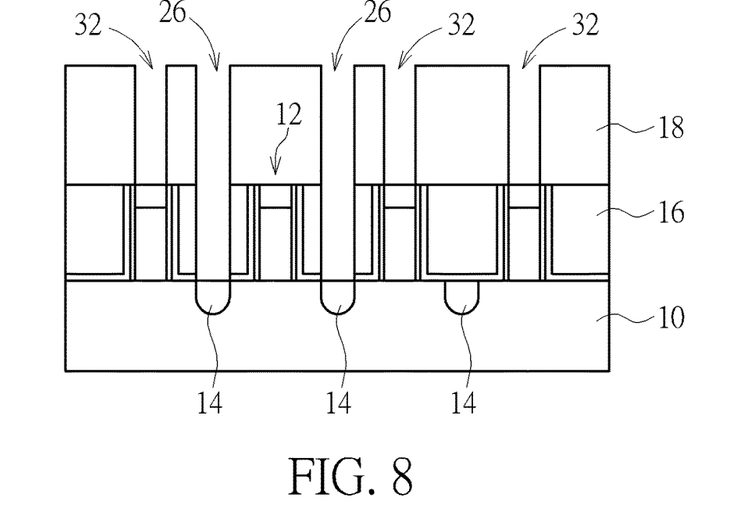
FIG. 8 is a fabricating stage following FIG. 7.

As shown in FIG. 7, a patterned triple-layered photoresist 30 is formed. The opening of the patterned triple-layered photoresist 30 defines the position of the gate contact hole. The gate structure 12 will be exposed from the gate contact hole later. As shown in FIG. 8, the interlayer dielectric 18 is etched by taking the triple-layered photoresist 30 as a mask to form a gate contact hole 32. Now, the gate structure 12 is exposed through the gate contact hole 32. Finally, the patterned triple-layered photoresist 30 is entirely removed. After that, contact plugs can be respectively form in the gate contact hole 32 and the source/drain contact hole 26.

Figure 9:
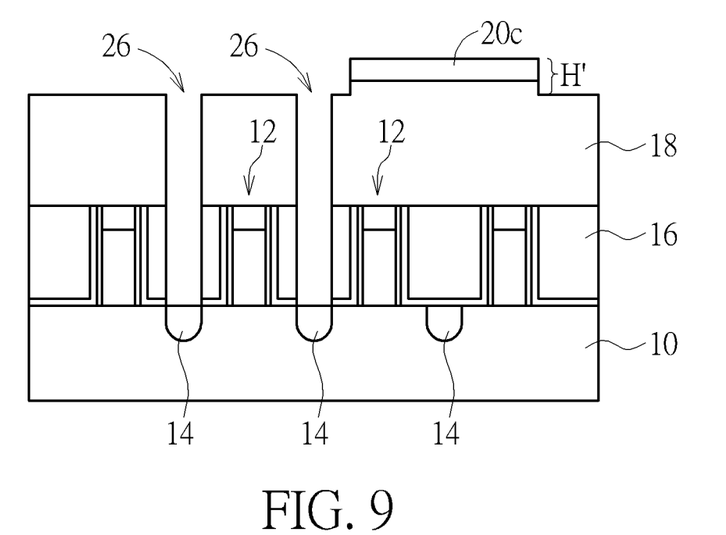
FIG. 9 depicts a step height on a gate structure.
Figure 10:
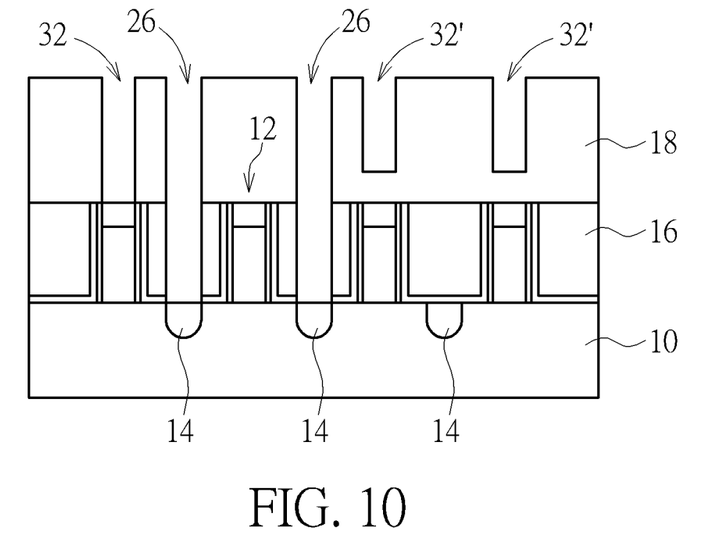
FIG. 10 is a fabricating stage following FIG. 9.

FIG. 9 to FIG. 10 depict a fabricating method of a contact hole according to an example of the present invention, wherein elements in FIG. 9 and FIG. 10 which are substantially the same as those in the embodiment of FIG. 1 to FIG. 8 are denoted by the same reference numerals; an accompanying explanation is therefore omitted. The difference between the example and the preferred embodiment is that the step height H' is not removed after the source/drain contact hole 26 is formed. Moreover, the step height H' consists of metal-containing layer 20c and the interlayer dielectric 18. The metal-containing layer 20c is removed before forming the gate contact hole 32, however, the protruded interlayer dielectric 18 is remained. As shown in FIG. 10, because the protruded interlayer dielectric 18 is not removed, while forming the gate contact hole 32, the protruded interlayer dielectric 18 needs to be etched. In this way, the gate structure 12 covered by the protruded interlayer dielectric 18 will have a gate contact hole 32' without enough thickness. On the other hand, the gate structure 12 which is not covered by the protruded interlayer dielectric 18 will have a gate contact hole 32 with enough thickness to expose the gate structure 12.

In the preferred embodiment of the present invention, the step height H is removed by the wet etching 28. In this way, the entire interlayer dielectric 18 has the same thickness when forming the gate contact hole 32. Therefore, all the gate contact hole 32 formed in the preferred embodiment can expose the gate structure 12.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of removing a step height on a gate structure, comprising:
   providing a substrate, wherein a gate structure is disposed on the substrate and a dielectric layer covers the gate structure and the substrate;
   forming a composite material layer to cover the dielectric layer, wherein the composite material layer comprises an etching stop layer, a sacrifice layer and a metal-containing layer stacked from bottom to top;
   removing part of the composite material layer to form a step height disposed directly on the gate structure;
   performing a wet etching to remove the step height; and
   after removing the step height, etching the dielectric layer to form a first contact hole to expose the gate structure.

2. The method of removing a step height on a gate structure of claim 1, wherein the wet etching comprises:
   removing the sacrifice layer entirely by using dilute hydrofluoric acid; and
   removing the etching stop layer entirely by using phosphoric acid.

3. The method of removing a step height on a gate structure of claim 1, wherein the step height consists of the sacrifice layer and the metal-containing layer.

4. The method of removing a step height on a gate structure of claim 1, further comprising a source/drain doping region disposed in the substrate at one side of the gate structure.

5. The method of removing a step height on a gate structure of claim 4, further comprising:
   after forming the step height, forming a patterned mask covering the composite material layer;
   before the wet etching, etching the dielectric layer to form a second contact hole within the dielectric layer by taking the patterned mask as a mask, wherein the source/drain doping region is exposed through the second contact hole.

6. The method of removing a step height on a gate structure of claim 1, wherein the sacrifice layer comprises silicon oxide, the etching stop layer comprises silicon nitride and the metal-containing layer comprises titanium nitride.

\* \* \* \* \*